United States Patent
Gordon et al.

(10) Patent No.: US 7,102,417 B2
(45) Date of Patent: Sep. 5, 2006

(54) INTEGRATED CIRCUIT DIE INCLUDING A TEMPERATURE DETECTION CIRCUIT, AND SYSTEM AND METHODS FOR CALIBRATING THE TEMPERATURE DETECTION CIRCUIT

(75) Inventors: Melia F. Gordon, Nagasaki (JP); Charles Ray Johns, Austin, TX (US); Hiroki Kihara, Austin, TX (US); Iwao Takiguchi, Kanagawa (JP); Tetsuji Tamura, Tokyo (JP); Michael Fan Wang, Austin, TX (US); Kazuaki Yazawa, Chiba (JP); Munehiro Yoshida, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 10/982,019

(22) Filed: Nov. 5, 2004

(65) Prior Publication Data
US 2006/0097757 A1    May 11, 2006

(51) Int. Cl.
*H03K 17/78* (2006.01)
(52) U.S. Cl. .............................. 327/512; 374/1; 702/99; 702/130
(58) Field of Classification Search ................ 327/512, 327/513; 374/1; 702/99, 130
See application file for complete search history.

(56) References Cited

U.S. PATENT DOCUMENTS

| | | | |
|---|---|---|---|
| 5,781,075 A | 7/1998 | Bolton, Jr. et al. | |
| 6,283,628 B1 | 9/2001 | Goodwin | |
| 6,674,185 B1 * | 1/2004 | Mizuta | 307/651 |
| 6,901,349 B1 * | 5/2005 | Nagasawa | 702/183 |

FOREIGN PATENT DOCUMENTS

| | | |
|---|---|---|
| EP | 1 411 630 A1 | 2/2003 |
| EP | 05 25 6839 | 2/2006 |

* cited by examiner

*Primary Examiner*—Kenneth B. Wells
(74) *Attorney, Agent, or Firm*—Carr LLP; Diana R. Gerhardt

(57) ABSTRACT

An integrated circuit die is disclosed including a temperature detection circuit and a memory configured to store calibration data. The temperature detection circuit is operatively coupled to the memory, and receives an input signal. The temperature detection circuit is configured to produce an output signal dependent upon the input signal and indicative of whether a temperature of the integrated circuit die is greater than a selected temperature. During a normal operating mode of the integrated circuit die the input signal comprises the calibration data. A system and methods for calibrating the temperature detection circuit are also described.

20 Claims, 4 Drawing Sheets

INTEGRATED CIRCUIT DIE INCLUDING A TEMPERATURE DETECTION CIRCUIT, AND SYSTEM AND METHODS FOR CALIBRATING THE TEMPERATURE DETECTION CIRCUIT

CROSS-REFERENCED APPLICATIONS

This application relates to U.S. patent application Ser. No. 11/052,495, entitled "TEMPERATURE SENSING CIRCUITS, AND TEMPERATURE DETECTION CIRCUITS INCLUDING SAME," filed Feb. 4, 2005.

BACKGROUND OF THE INVENTION

1. Field of the Invention

This invention relates generally to semiconductor electronics and, more particularly, to integrated circuits.

2. Description of the Related Art

A wafer fabrication process typically forms many identical integrated circuits upon each of several silicon wafers processed as a group (i.e., lot). Each integrated circuit is formed within a designated area of a wafer, and includes electronic devices electrically coupled by conductive traces called interconnect lines (i.e., interconnects). Interconnects are typically patterned from conductive layers formed on or above the surface of a silicon substrate. Following wafer fabrication, the individual integrated circuit dice are separated from the wafers, and each functional die is typically secured within a protective semiconductor device package.

Integrated circuits dissipate electrical power during operation, transforming electrical energy into heat energy. At the same time, several key operating parameters of an integrated circuit typically vary with temperature, and reliable device operation within specifications occurs only within a defined operating temperature range. For high performance devices, such as microprocessors, specified performance is only achieved when the temperature of the device is below a specified maximum operating temperature. Operation of the device at a temperature above the specified maximum operating temperature, may result in irreversible damage to the device. In addition, it has been established that the reliability of an integrated circuit decreases with increasing operating temperature. The heat energy produced by an integrated circuit during operation must thus be removed from the integrated circuit at a rate which ensures operational and reliability requirements are met.

The continued demand for higher performance microprocessors, aided by advances in integrated circuit fabrication and packaging technologies, has led to higher clock signal frequencies (i.e., increased clock signal speeds) and increased levels of integration. Despite shrinking device sizes, maximum microprocessor power dissipations continue to increase at exponential rates. As a result, it is becoming increasingly more difficult to operate high performance integrated circuits (e.g., microprocessors) such that maximum operating temperatures, specified by manufactures for the operational stability and reliability reasons described above, are not exceeded.

It would thus be beneficial to have an integrated circuit die including a temperature detection circuit, and a system and method for calibrating the temperature detection circuit. The temperature detection circuit may be, for example, used to keep a temperature of the die below a maximum operating temperature of the integrated circuit.

SUMMARY OF THE INVENTION

An integrated circuit die is disclosed including a temperature detection circuit and a memory configured to store calibration data. The temperature detection circuit is operatively coupled to the memory, and receives an input signal. The temperature detection circuit is configured to produce an output signal dependent upon the input signal and indicative of whether a temperature of the integrated circuit die is greater than a selected temperature. During a normal operating mode of the integrated circuit die the input signal comprises the calibration data. A system and methods for calibrating the temperature detection circuit are also described.

BRIEF DESCRIPTION OF THE DRAWINGS

For a more complete understanding of the present invention and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
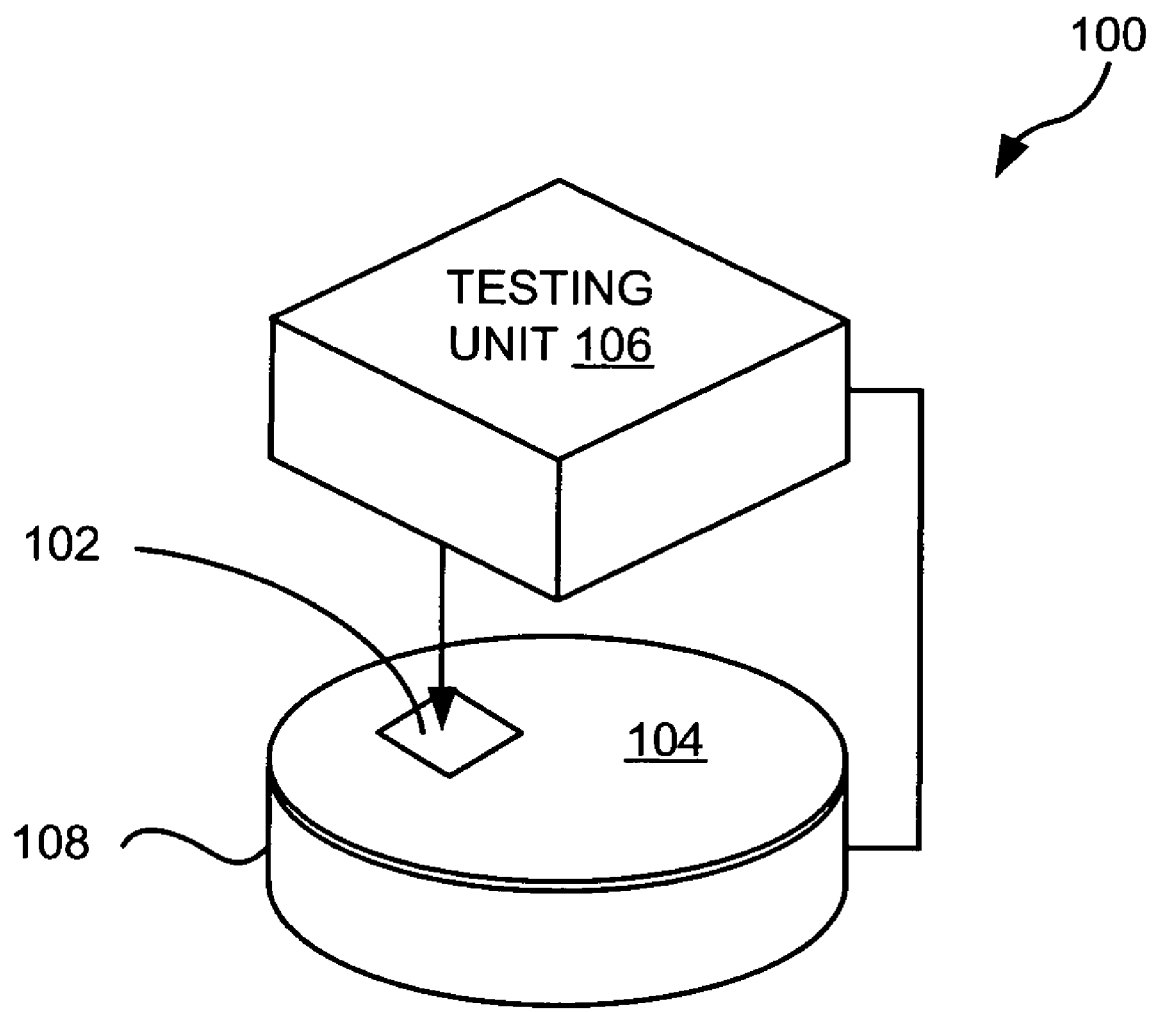
FIG. 1 is a perspective view of one embodiment of a system wherein a fabricated integrated circuit die, formed within a designated area of a semiconductor wafer, is undergoing testing by a testing unit.

Turning now to FIG. 1, the reference numeral 100 generally indicates a system wherein a fabricated integrated circuit die 102, formed within a designated area of a semiconductor wafer 104, is undergoing testing by a testing unit 106. During the testing, the wafer 104 is held in place by a wafer chuck 108. In general, the wafer chuck 108 includes a heating mechanism to heat the wafer chuck 108 to temperatures above an ambient temperature. The heating mechanism is controlled by the testing unit 106. During the testing, a temperature detection circuit of the die 102 is calibrated.

Figure 2:
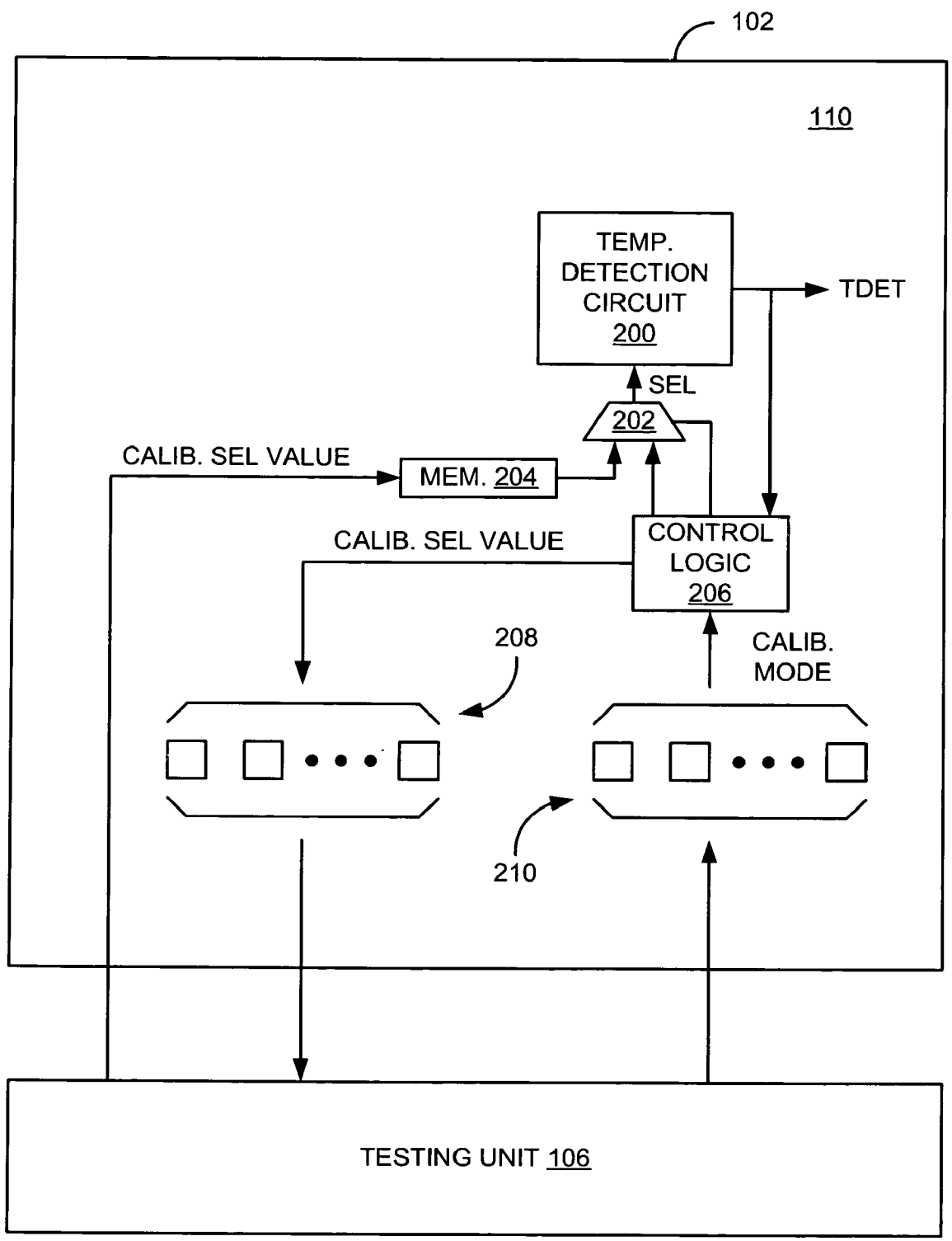
FIG. 2 is a diagram of one embodiment of the die of FIG. 1, wherein the die has a temperature detection circuit formed on and in a surface of a semiconductor substrate.

FIG. 2 is a diagram of one embodiment of the die 102 of FIG. 1. In the embodiment of FIG. 2, the die 102 includes a temperature detection circuit 200. The temperature detection circuit 200 is formed on and in a surface of a semiconductor substrate 110 of the die 102 (e.g., during a wafer fabrication process), and constitutes an "on-chip" thermal detection circuit. In the embodiment of FIG. 2, the temperature detection circuit 200 is used to detect when a temperature of the die 102 is above the selected temperature. During a calibration procedure, the temperature detection circuit 200 is calibrated such that the temperature detection circuit 200 produces an output temperature detect "TDET" signal indicative of whether a temperature of the die 102 is greater than (i.e., above) a selected temperature.

The TDET signal produced by the temperature detection circuit 200 is basically a digital signal, asserted when a temperature of the die 102 is greater than (i.e., above) a selected temperature, and de-asserted when the temperature of the die 102 is less than (i.e., below) the selected temperature. The TDET signal is preferably used by logic within the die 102 such that when the TDET signal is asserted, measures are taken within the die 102 to lower the temperature of the die 102.

In the embodiment of FIG. 2, the die 102 also includes a multiplexer (MUX) 202, a memory 204, control logic 206, several scan registers 208, and multiple contacts or pads 210. The scan registers 208 are part of a network of scan registers connected together in series to form a scan chain. Such scan chains are commonly used to test the functionality of digital integrated circuits. For example, during functional testing of the die 102 (e.g., by the testing unit 106), input data values can be serially "scanned" through the scan registers of the scan chain, then applied by the scan registers to logic of the die 102 in parallel. Output data values produced by the logic can then be captured by the scan registers in parallel, and serially scanned out of the scan registers of the scan chain.

In general, the contacts or pads 210 are areas of electrically conductive materials (e.g., metals) formed on an accessible surface of the die 102. In a particular embodiment, the contacts or pads 210 are controlled collapse chip connect (C4) contacts or pads.

In general, the die 102 operates in a calibration mode and a normal operating mode. As described below, the memory 204 is used to store a calibration value generated during the calibration procedure performed during the calibration mode of the die 102. During the normal operating mode of the die 102, the calibration value stored in the memory 204 is preferably provided to the temperature detection circuit 200. Accordingly, the memory 204 is preferably a non-volatile memory; a memory that retains stored values when electrical power is not applied to the die 102. Suitable types of non-volatile memories include programmable read only memories (PROMs) having fuse (or anti-fuse) elements. The memory 204 may include, for example, eFuse electronic fuse elements (eFuse is a patented technology of the IBM Corporation, Armonk, N.Y.).

The MUX 202 receives data from the memory 204 at one input and data from the control logic 206 at another input. MUX 202 produces an output select "SEL" signal that is either the data from the memory 204 or the data from the control logic 206 dependent upon a control signal from the control logic 206. The MUX 202 provides the output SEL signal to the temperature detection circuit 200. In general, and as described in detail below, the SEL signal determines a temperature of the die 102 at which the temperature detection circuit 200 asserts the output TDET signal, indicating that the temperature of the die 102 is above a selected temperature.

As indicated in FIG. 2, the control logic 206 is coupled to the contacts 210. During the calibration procedure, the testing unit 106 applies one or more signals to the contacts 210 indicating the calibration mode of the die 102. When the control logic 206 receives the one or more signals from the contacts 210 indicating the calibration mode, the control logic 206 drives the control signal to the MUX 202 such that the output SEL signal of the MUX 202 is the data from the control logic 206.

In general, the SEL signal is an n-bit signal, wherein n is an integer greater than or equal to 1. The n bits of the SEL signal are ordered, and specify a corresponding value. In general, the SEL signal has a corresponding value between 0 and $2^n-1$. For example, a 4-bit SEL signal may be denoted "SEL<0:3>," where bit SEL<0> is the most significant bit, and SEL<3> is the least significant bit. The corresponding value of the SEL<0:3>signal is: $(SEL<0>) \cdot 2^3+(SEL<1>) \cdot 2^2+(SEL<2>) \cdot 2^1+(SEL<3>)$. Thus the 4-bit SEL signal SEL<0:3> specifies a value between 0 and 15. Correspondingly, the data from the memory 204 and from the control logic 206 is conveyed by n-bit signals having values between 0 and $2^n-1$. As indicated In FIG. 2, the control logic 206 receives the TDET signal produced by the temperature detection circuit 200.

Referring to FIGS. 1 and 2, during the calibration procedure, the wafer 104 including the die 102 is held in place via the wafer chuck 108. The wafer chuck 108 includes a heating mechanism controlled by the testing unit 106 to heat the wafer chuck 108 to temperatures above an ambient temperature. During the calibration procedure, the testing unit 106 controls the heating mechanism of the wafer chuck 108 to heat the wafer 104, including the die 102, to a selected temperature.

When the wafer 104, including the die 102, are heated to the selected temperature, the testing unit 106 applies the one or more signals to the contacts 210 indicating the calibration mode. In response, the control logic 206 drives the control signal to the MUX 202 such that the output SEL signal of the MUX 202 is the data from the control logic 206.

The control logic 206 first provides data to the MUX 202 having the value 0. The control logic then determines if the TDET signal from the temperature detection circuit 200 is asserted. As described above, the TDET signal is asserted when the TDET signal indicates that a temperature of the die 102 is above the selected temperature. If the TDET signal from the temperature detection circuit 200 is not asserted, the control logic 206 provides data to the MUX 202 having the value 1, and again determines if the TDET signal from the temperature detection circuit 200 is asserted. The control logic 206 continues incrementing the value of the data provided to the MUX 202 by 1 until the temperature detection circuit 200 asserts the TDET signal.

When the temperature detection circuit 200 asserts the TDET signal, the value of the data provided to the MUX 202 is generally m, where $0<=m<=2^n-1$. The control logic 206 provides the value m to the scan registers 208 as a "CALIBRATION SELECT VALUE." The scan registers 208 store the CALIBRATION SELECT VALUE. As indicated in FIG. 2, the testing unit 106 retrieves the CALIBRATION SELECT VALUE from the scan registers 208 (e.g., scans the CALIBRATION SELECT VALUE out of the scan registers 208), and stores the CALIBRATION SELECT VALUE in the memory 204.

Following the above calibration procedure, and during the normal operating mode of the die 102, the control logic 206 drives the control signal to the MUX 202 such that the output SEL signal of the MUX 202 is the data from the memory 204 (i.e., the CALIBRATION SELECT VALUE stored therein). As a result, the temperature detection circuit 200 asserts the output TDET signal when the temperature of the die 102 is equal to or greater than the selected temperature.

Figure 3:
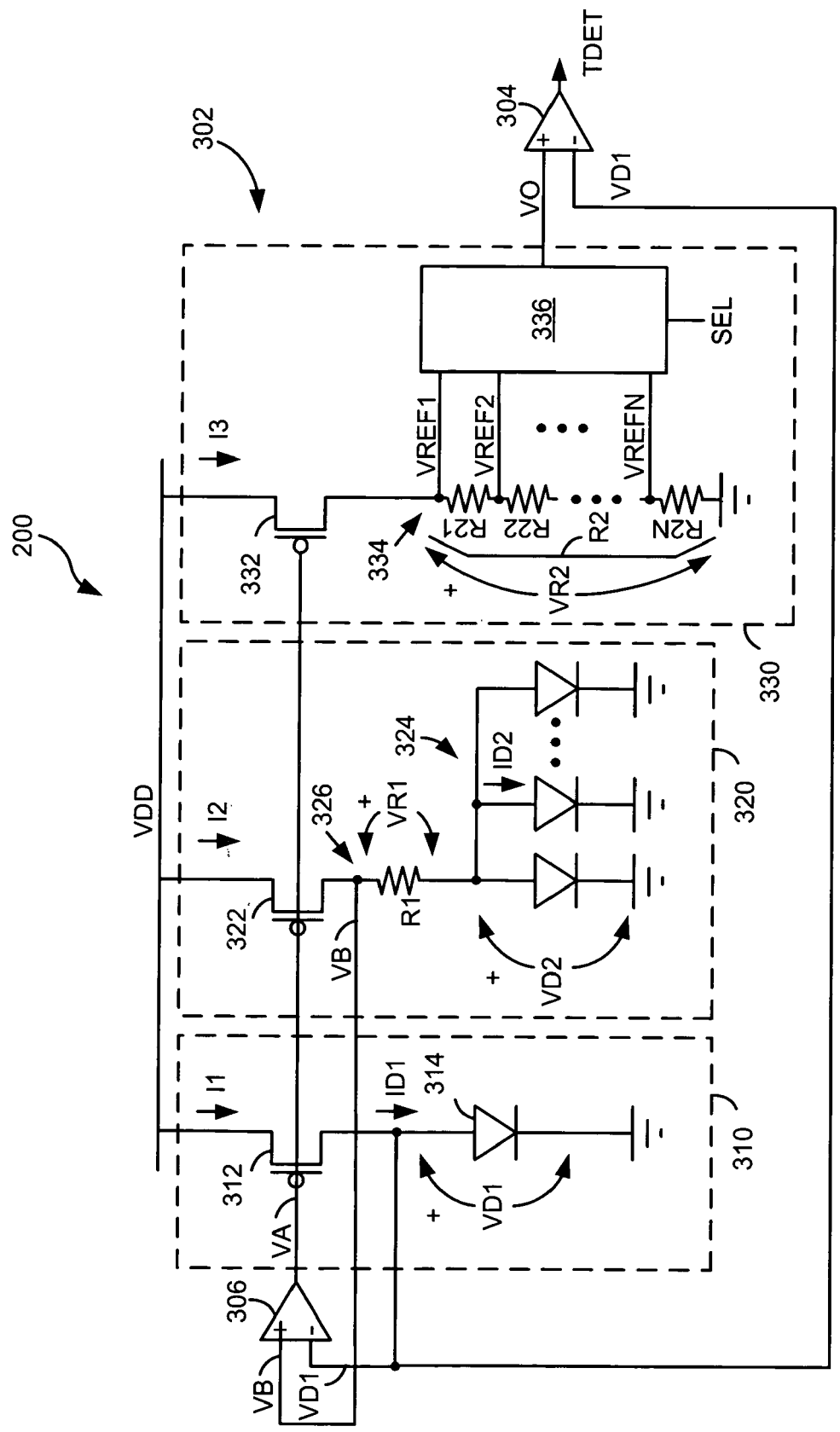
FIG. 3 is a diagram of one embodiment of the temperature detection circuit of FIG. 2.

FIG. 3 is a diagram of one embodiment of the temperature detection circuit 200 of FIG. 2. In the embodiment of FIG. 3, the temperature detection circuit 200 includes a temperature sensing circuit 302 and a comparator 304. In general, two analog voltages produced by the temperature sensing circuit 302 are provided to the comparator 304 and used to detect a condition wherein a temperature of the temperature sensing circuit 302 is above a selected temperature. One of the analog voltages has a magnitude that increases with increasing temperature, and the other analog voltage has a magnitude that decreases with increasing temperature.

In the embodiment of FIG. 3, an analog voltage "VR2" produced within the temperature sensing circuit 302 has a magnitude that increases linearly with increasing temperature. The voltage VR2 is divided into n analog voltages "VREF1," "VREF2," . . . "VREFn" where n is greater than or equal to 2. Each of the n analog voltages has a magnitude that increases with increasing temperature. One of the n analog voltages is selectively produced as an output analog voltage "VO," and the output analog voltage VO is provided to the comparator 304. The comparator 304 uses the analog voltage VO to detect when the integrated circuit die 102 is above the selected temperature.

In general, the comparator 304 produces the output signal TDET such that the output signal TDET is in one voltage state (e.g., a low voltage state) when the temperature of the temperature sensing circuit 302 is below the selected temperature, and in another voltage state (e.g. a high voltage state) when the temperature of the temperature sensing circuit 302 is above the selected temperature. Thus the output signal TDET of the temperature detection circuit 200 is basically a digital signal indicative of whether the temperature of the temperature sensing circuit 302 is above the selected temperature.

In the embodiment of FIG. 3, the temperature sensing circuit 302 includes a differential amplifier 306, a first portion 310, a second portion 320, and a third portion 330. The first portion 310 includes a p-channel metal oxide semiconductor (PMOS) transistor 312 and a p-n junction element 314 connected in series. The PMOS transistor 312 receives an output analog voltage "VA" of the differential amplifier 306 at a gate terminal. The analog voltage VA establishes a current I1 through the series connected PMOS transistor 312 and p-n junction element 314. An analog voltage "VD1" is developed across the forward biased p-n junction element 314, and a current ID1 flows through the p-n junction element 314.

The second portion 320 includes a PMOS transistor 322, a resistor labeled "R1," and m p-n junction elements 324, where m is generally greater than or equal to 2. The m p-n junction elements 324 are connected in parallel. The PMOS transistor 322 is connected in series with the resistor R1 and the m p-n junction elements 324. A source terminal of the PMOS transistor 322 is connected to the positive power supply voltage VDD, and a drain terminal of the PMOS transistor 322 is connected to one terminal of the resistor R1 at a node 326. The other terminal of the resistor R1 is connected to p-type terminals of the m p-n junction elements 324. N-type terminals of the m p-n junction elements 324 are connected to the reference ground power supply voltage. The p-n junction element 314 and the m p-n junction elements 324 may be, for example, diodes. Alternately, the p-n junction element 314 and the m p-n junction elements 324 may be diode-connected bipolar transistors.

Like the PMOS transistor 312 of the first portion 310, the PMOS transistor 322 of the second portion 320 receives the output analog voltage VA of the differential amplifier 306 at a gate terminal. The analog voltage VA establishes a current I2 through the PMOS transistor 322, the resistor R1, and the p-n junction elements 324. In the embodiment of FIG. 3, the PMOS transistors 312 and 322 are fabricated similarly, and I2=I1. An analog voltage "VR1" is developed across the resistor R1, where VR1=I2·R1. In general, an analog voltage "VD2" is developed across the m p-n junction elements 324 connected in parallel, and a current ID2 flows through each of the m p-n junction elements 324.

An analog voltage "VB" is developed at the node 326 of the second portion 320, wherein VB=VR1+VD2. The analog voltage VB is provided to a positive "+" terminal of the differential amplifier 306, and the analog voltage VD1 produced by the first portion 310 is provided to a negative "−" terminal of the differential amplifier 306. In general, the output analog voltage VA of the differential amplifier 306 is stable when VB=VD1.

The third portion 330 includes a PMOS transistor 332 and voltage divider network 334 connected in series. The voltage divider network 334 includes n resistors connected in series and labeled "R21," "R22," . . . , "R2n" in FIG. 3. In general, n is greater than or equal to 2. A total resistance of the voltage divider network 334 is denoted "R2." A source terminal of the PMOS transistor 332 is connected to a positive power supply voltage "VDD," and a drain terminal of the PMOS transistor 332 is connected to one terminal of the resistor R21 of the voltage divider network 334. A terminal of the resistor R2n of the voltage divider network 334 is connected to a reference ground power supply voltage.

The PMOS transistor 332 receives an output analog voltage "VA" of a differential amplifier 306 at a gate terminal. The analog voltage VA establishes a current I3 through the PMOS transistor 332 and the n resistors of the voltage divider network 334. In the embodiment of FIG. 3, the PMOS transistors 312, 322, and 332 are fabricated similarly, and I1=I2=I3. As described above, the total resistance of the voltage divider network 334 is equal to R2, and the analog voltage VR2 is developed across the voltage divider network 334.

The voltage divider network 334 divides the analog voltage VR2 into n analog voltages signals "VREF1," "VREF2," . . . "VREFn." The analog voltage signal VREF1 is produced at a node where the drain terminal of the PMOS transistor 332 is connected to the terminal of the resistor R21 of the voltage divider network 334, and VREF1=VR2. The analog voltage signal VREF2 is produced at a node between the other terminal of the resistor R21 and a terminal of the resistor R22 of the voltage divider network 334. The analog voltage signal VREFn is produced at a node between a terminal of a resistor R2($n$-1) and a terminal of the resistor R2n.

In one embodiment, the resistances of the resistors R21, R22, . . . , R2n are substantially equal, and an analog voltage VREFk produced by the voltage divider network 334 is substantially equal to $VR2 \cdot [(n-k-1)/n]$ where k is between 1 and n. In other embodiments the resistors $R21, R22, \ldots, R2n$ may have different values. In one particular embodiment, the resistances of the resistors $R21, R22, \ldots, R2(n-1)$ are substantially equal, and the resistor $R2n$ is a base resistor having a value that differs from the other resistors.

In the embodiment of FIG. 3, the third portion 330 also includes an analog multiplexer 336. In general, the analog multiplexer 336 receives the n analog voltages signals produced by the voltage divider network 334 at data input terminals, and a control signal "SEL" at a control terminal or port. The analog multiplexer 336 produces one of the n analog voltages dependent upon the SEL signal. The third portion 330 produces the one of the n analog voltages produced by the analog multiplexer 336 as the output analog voltage VO.

Regarding the operation of the temperature sensing circuit 302, the p-n junction element 314 of the first portion 310 is forward biased. The relationship between the analog voltage VD1 across the p-n junction element 314 and the current ID1 through the p-n junction element 314 is given by the well-known diode equation:

$$ID1 = (Is) \cdot \{\exp[(VD1) \cdot (q/\eta kT)] - 1\}$$

where "Is" is the saturation current, "q" is the electron charge, "$\eta$" is an empirical constant, "k" is Boltzmann's constant, and "T" is the absolute temperature of the p-n junction element 314 (in degrees Kelvin).

Assuming $(VD1) \cdot (q/\eta kT)$ is much greater than 1, VD1 can be estimated as:

$$VD1 = (\eta kT/q) \cdot \ln(ID1/Is).$$

Although the absolute temperature T is in the numerator of the above equation for the analog voltage VD1, and might suggest that the analog voltage VD1 increases with increasing absolute temperature T of the p-n junction element 314, it is well know that the saturation current Is increases with increasing temperature. As a result, the analog voltage VD1 across the p-n junction element 314 decreases linearly with increasing absolute temperature T of the temperature sensing circuit 302. In the embodiment of FIG. 3, the p-n junction element 314 is formed by doping a silicon substrate, and the rate of change of the analog voltage VD1 with temperature is about $-2.2$ millivolts (mV) per degree Kelvin (or Celsius).

The m p-n junction elements 324 of the second portion 320 are also forward biased, and similar equations apply. It was noted above that $I1=I2=I3$. Using:

$$I1 = ID1 = (Is) \cdot \{\exp[(VD1) \cdot (q/\eta kT)] - 1\}, \text{ and}$$

$$I2 = m \cdot ID2 = m \cdot (Is) \cdot \{\exp[(VD2) \cdot (q/\eta kT)] - 1\},$$

it can be shown that:

$$VD1 = \ln(m) \cdot (\eta kT/q) + VD2.$$

It was also noted above that the output analog voltage VA of the differential amplifier 306 is stable when $VB=VD1$, and that the analog voltage VB developed at the node 326 of the second portion 320 is given by $VB=VR1+VD2$. Thus:

$$VR1 = VB - VD2 = \ln(m) \cdot (\eta kT/q).$$

It is noted that the analog voltage VR1 developed across the resistor R1 in the second portion 320 is directly proportional to the absolute temperature T of the temperature sensing circuit 302, and is dependent upon m, the number of the p-n junction elements 324. That is, VR1 increases linearly with increasing absolute temperature T of the temperature sensing circuit 302, and VR1 increases with increasing m.

As the total resistance of the voltage divider network 334 is R2, the analog voltage VR2 developed across the voltage divider network 334 is given by $VR2=I3 \cdot R2$. It is also true the $I3=I2$, $I2=VR1/R1$, and $VR1=\ln(m) \cdot (\eta kT/q)$. Thus:

$$VR2 = (VR1/R1) \cdot R2 = VR1(R2/R1) = \ln(m) \cdot (\eta kT/q) \cdot (R2/R1).$$

It is noted that the analog voltage VR2 produced across the resistance R2 of the voltage divider network 334 is directly proportional to the analog voltage VR1 developed across the resistor R1 in the second portion 320. Thus like the analog voltage VR1, the analog voltage VR2 increases linearly with increasing absolute temperature T of the temperature sensing circuit 302. Accordingly, in the embodiment where the resistances of the resistors $R21, R22, \ldots, R2n$ are substantially equal, the voltage signal VREFk produced by the voltage divider network 334 is substantially equal to $\ln(m) \cdot (\eta kT/q) \cdot [(n-k-1)/n]$ where k is between 1 and n. The values of the resistor R1 and the total resistance R2 of the voltage divider network 334 can advantageously be selected to achieve a desired rate of change of the analog voltage VR2 with the absolute temperature T of the temperature sensing circuit 302.

Further, in the embodiment of FIG. 1, the resistors R1 and $R21, R22, \ldots, R2n$ of the voltage divider network 334 are fabricated in a similar manner. In this situation, the change in the resistance of resistor R1 due to temperature is advantageously canceled by corresponding changes in the resistors R1 and $R21, R22, \ldots, R2n$ of the voltage divider network 334 due to temperature.

In the embodiment of FIG. 3, the comparator 304 of the temperature detection circuit 200 receives the output analog voltage VO produced by the third portion 330 of the temperature sensing circuit 302 at a positive "+" terminal, and the analog voltage VD1 produced by the first portion 310 of the temperature sensing circuit 302 at a negative "−" terminal. The comparator 304 produces the output signal TDET having a low voltage state (e.g., substantially the reference ground power supply voltage) when a magnitude of the analog voltage VD1 is greater than a magnitude of the analog voltage VO (i.e., when the temperature of the temperature sensing circuit 302 is less than the selected temperature). The output signal TDET is in a high voltage state (e.g., substantially the positive power supply voltage VDD) when the magnitude of the analog voltage VO is greater than the magnitude of the analog voltage VD1 (i.e., the temperature of the temperature sensing circuit 302 is greater than the selected temperature). As described above, the output signal TDET is basically a digital signal indicative of whether the temperature of the semiconductor substrate is above the selected temperature.

In the embodiment of FIGS. 2–3, the SEL signal provided to the analog multiplexer 336 of the temperature detection circuit 200 is a digital signal including $\text{int}[\log_2(n)]$ bits, wherein the "int" operation returns the smallest integer "i" wherein $2^i$ is greater than or equal to n. As described above, the n bits of the SEL signal are ordered, and specify a corresponding value between 0 and $2^n-1$. For example, a 4-bit SEL signal specifies a value between 0 and 15.

During the design of the temperature detection circuit 200 of FIG. 3, a detection temperature T (deg. C.) and a desired accuracy (deg. C.) are selected. The error quantities TE+ and TE− for the temperature detection circuit 200 are determined (e.g., by estimation or experimentation). The total resistance R2 of the voltage divider network 334 is selected such that the analog voltage VR2 developed across the voltage divider network 334 ideally detects a temperature [T−(TE−)]. The number n of the resistors of the voltage divider network 334 is determined using:

$$n=\{[(TE+)+(TE-)]/(\text{desired accuracy})-1\}.$$

For example, assume the temperature detection circuit 200 of FIG. 3 is to be designed for a detection temperature T of 85 deg. C. and a desired accuracy of +/−2 deg. C. Also assume error quantities TE+ and TE− of 16 deg. C. and 14 deg. C., respectively, are determined for a technology and manufacturing process to be used to fabricate the temperature detection circuit 200. The total resistance R2 of the voltage divider network 334 is selected such that the analog voltage VR2 developed across the voltage divider network 334 ideally detects a temperature [T− (TE−)]=(85−14)=71 deg. C. The number n of the resistors of the voltage divider network 334 is determined as:

$$n=\{[(16)+(14)]/(2)-1\}=14.$$

The SEL signal is to have i bits, where:

$$i=\text{int}[\log_2(14)]=4.$$

After fabrication of the temperature detection circuit 200 of FIG. 3, the bits of the SEL signal (i.e., the value of the SEL signal) provided to the analog multiplexer 336 of the temperature detection circuit 200 can be selected such that the temperature detection circuit 200 detects the selected temperature T plus or minus a value that is less than or equal to the desired accuracy in degrees.

Figure 4:
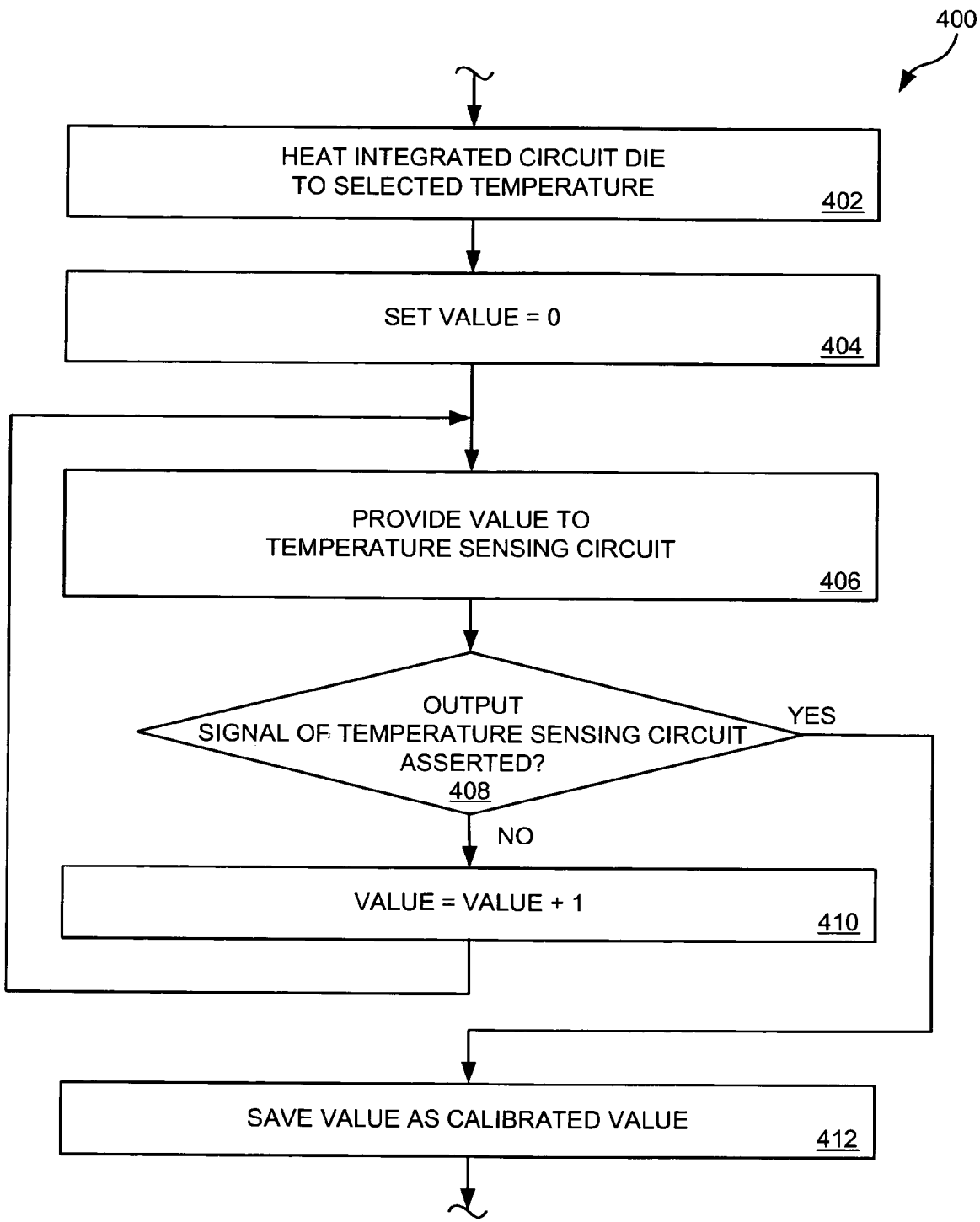
FIG. 4 is a flow chart of one embodiment of a method for calibrating a temperature detection circuit formed on an integrated circuit die and producing an output signal dependent upon an input signal.

FIG. 4 is a flow chart of one embodiment of a method 400 for calibrating a temperature detection circuit formed on an integrated circuit die and producing an output signal dependent upon an input signal. An example of such an integrated circuit die is the die 102 of FIGS. 1 and 2, wherein the input signal is the SEL signal, and the output signal is the TDET signal. The method 400 may be implemented by the system 100 of FIG. 1.

During a step 402 of the method 400, the integrated circuit die is heated to a selected temperature. A value is set to 0 during a step 404. During a step 406, the value is provided to the temperature detection circuit as the input signal (e.g., of the SEL signal described above). During a decision step 408, a determination is made as to whether the temperature detection circuit asserts the output signal (e.g., the TDET signal produced by the temperature detection circuit 200 of FIGS. 1–3) in response to the input signal. If the temperature detection circuit does not assert the output signal, a step 410 is performed. If, on the other hand, the temperature detection circuit asserts the output signal, a step 412 is performed.

During the step 410, that value is incremented. Following the step 410, the steps 406 and 408 are repeated. During the step 412, the value is saved as a calibration value (e.g., the CALIBRATION SELECT VALUE). For example, the value may be saved in a memory (e.g., in the memory 204 of FIG. 2).

Following the calibration method 400, and during a normal operating mode of the die, the calibration value may be provided to the temperature detection circuit such that the temperature detection circuit asserts the output signal when the temperature of the die is greater than (i.e., above) the selected temperature.

It is noted that other methods for calibrating the temperature detection circuit are possible and contemplated. For example, the method 400 described above selects values starting with 0, and works for the die 102 of FIGS. 1–3 wherein higher values of the input SEL signal result in higher detected temperatures of the die 102. In other temperature detection circuits, higher values of input signals may result in lower detected temperatures of integrated circuit dice including the temperature detection circuits.

In a more general method for calibrating a temperature detection circuit formed on an integrated circuit die, two values, a first value and a second value, may be selected in any manner. Either the first value or the second value should be saved as the calibration value if: (i) the first and second values are consecutive values (e.g., integer values that differ by 1), and (ii) the temperature detection circuit asserted the output signal for one of the values but not for the other value. That is, the temperature detection circuit asserted the output signal for either the first value or the second value, but not for both the first value and the second value.

Accordingly, in one embodiment, the control logic 206 of the integrated circuit die 102 of FIG. 2 selects a value, provides the selected value to the temperature detection circuit 200 of FIG. 2 as the SEL signal, and determines if the temperature detection circuit 200 asserts the output TDET signal in response to the selected value. The control logic 206 saves either the selected value or a previously selected value in the scan registers 208 of FIG. 2 as a calibration value if: (i) the selected value and the previously selected value are consecutive values, and (ii) the temperature detection circuit asserted the output signal for either the selected value or the previously selected value, but not for both the selected value and the previously selected value.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:
1. An integrated circuit die, comprising:
a memory configured to store calibration data;
a temperature detection circuit operatively coupled to the memory and to receive an input signal, wherein the temperature detection circuit is configured to produce an output signal dependent upon the input signal and indicative of whether a current temperature of the integrated circuit die is greater than a selected temperature;
wherein the temperature detection circuit is configured to produce a plurality of analog voltages, and wherein each of the analog voltages is dependent upon the current temperature of the integrated circuit die;
wherein the temperature detection circuit comprises selection logic coupled to receive each of the analog voltages and the input signal, and configured to select one of the analog voltages dependent upon the input signal;
wherein the temperature detection circuit is configured to use the selected analog voltage to produce the output signal; and wherein during a non-calibration mode of the integrated circuit die the input signal comprises the calibration data.

2. The integrated circuit die as recited in claim 1, wherein the temperature detection circuit comprises a voltage divider network configured to produce the plurality of analog voltages.

3. The integrated circuit die as recited in claim 1, wherein the selection logic comprises an analog multiplexer.

4. The integrated circuit die as recited in claim 1, wherein the temperature detection circuit is formed on and in a surface of a semiconductor substrate.

5. The integrated circuit die as recited in claim 1, wherein the input signal is a n-bit digital signal, wherein n is an integer greater than or equal to 1.

6. The integrated circuit die as recited in claim 1, wherein the memory comprises a non-volatile memory.

7. The integrated circuit die as recited in claim 1, further comprising control logic operatively coupled to the temperature detection circuit, wherein during a calibration mode of the integrated circuit die the input signal originates from the control logic.

8. The integrated circuit die as recited in claim 7, wherein the control logic is coupled to receive the output signal produced by the temperature detection circuit, and wherein during the calibration mode the control logic is configured to select a value, to provide the selected value to the temperature detection circuit as the input signal, to determine if the temperature detection circuit asserts the output signal in response to the selected value, and to save either the selected value or a previously selected value as a calibration value if: (i) the selected value and the previously selected value are consecutive values, and (ii) the temperature detection circuit asserted the output signal for either the selected value or the previously selected value, but not for both the selected value and the previously selected value.

9. The integrated circuit die as recited in claim 8, further comprising a plurality of scan registers coupled to the control logic, wherein the control logic is configured to save either the selected value or a previously selected value in the scan registers as a calibration value if: (i) the selected value and the previously selected value are consecutive values, and (ii) the temperature detection circuit asserted the output signal for either the selected value or the previously selected value, but not for both the selected value and the previously selected value.

10. The integrated circuit die as recited in claim 7, further comprising a multiplexer coupled to the memory, the temperature detection circuit, and the control logic, and configured to provide the input signal to the temperature detection circuit, wherein the multiplexer is operated to provide the calibration data from the memory to the temperature detection circuit as the input signal during the non-calibration mode, and to provided data from the control logic to the temperature detection circuit as the input signal during the calibration mode.

11. The integrated circuit die as recited in claim 1, wherein the output signal is a digital signal.

12. The integrated circuit die as recited in claim 1, further comprising a plurality of contacts formed on a surface of the integrated circuit die for receiving one or more signals indicative of the calibration mode.

13. A method for calibrating a temperature detection circuit formed on an integrated circuit die and producing an output signal dependent upon an input signal, the method comprising:

heating the integrated circuit die to a selected temperature;
selecting a first value for the input signal;
providing the first value to the temperature detection circuit as the input signal;
determining if the temperature detection circuit asserts the output signal in response to the first value;
selecting a second value for the input signal;
providing the second value to the temperature detection circuit as the input signal;
determining if the temperature detection circuit asserts the output signal in response to the second value; and
saving either the first or second value as a calibration value if: (i) the first and second values are consecutive values, and (ii) the temperature detection circuit asserted the output signal for either the first value or the second value, but not for both the first value and the second value.

14. The method as recited in claim 13, wherein the input signal is a n-bit digital signal, wherein n is an integer greater than or equal to 1, and wherein the first and second values are values between 0 and (2n−1).

15. The method as recited in claim 13, wherein the first and second values are integer values, and are consecutive values if they differ by 1.

16. The method as recited in claim 13, wherein the saving the second value as the calibration value comprises:
saving either the first value or the second value as a calibration value if: (i) the first and second values are consecutive values, and (ii) the temperature detection circuit either: asserted the output signal for the first value but not for the second value, or asserted the output signal for the second value but not for the first value.

17. The method as recited in claim 13, wherein the saving the second value as the calibration value comprises:
saving the second value as a calibration value if: (i) the first and second values are consecutive values, (ii) the temperature detection circuit did not assert the output signal for the first value, and (iii) the temperature detection circuit did assert the output signal for the second value.

18. A method for calibrating a temperature detection circuit formed on an integrated circuit die and producing an output signal dependent upon an input signal, the method comprising:

heating the integrated circuit die to a selected temperature;
setting a value equal to 0;
providing the value to the temperature detection circuit as the input signal;
determining if the temperature detection circuit asserts the output signal in response to the value;
if the temperature detection circuit did not assert the output signal in response to the value, incrementing the value and repeating the providing and determining steps;
if the temperature detection circuit did assert the output signal in response to the value, saving the value as a calibration value.

19. The method as recited in claim 18, wherein the input signal is a n-bit digital signal, wherein n is an integer greater than or equal to 1.

20. The method as recited in claim 18, wherein the incrementing the value comprises adding 1 to the value.

* * * * *